United States Patent
Li et al.

(10) Patent No.: US 11,062,900 B2
(45) Date of Patent: Jul. 13, 2021

(54) METHOD OF REDUCING EFFECTIVE OXIDE THICKNESS IN A SEMICONDUCTOR STRUCTURE

(71) Applicant: APPLIED MATERIALS, INC., Santa Clara, CA (US)

(72) Inventors: Luping Li, Santa Clara, CA (US); Shih Chung Chen, Cupertino, CA (US); Kazuya Daito, Milipitas, CA (US); Lin Dong, San Jose, CA (US); Zhebo Chen, San Jose, CA (US); Yixiong Yang, Fremont, CA (US); Steven Hung, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/699,712

(22) Filed: Dec. 1, 2019

(65) Prior Publication Data
US 2020/0176247 A1    Jun. 4, 2020

Related U.S. Application Data

(60) Provisional application No. 62/775,218, filed on Dec. 4, 2018.

(51) Int. Cl.
*H01L 21/02* (2006.01)
*H01L 21/311* (2006.01)

(52) U.S. Cl.
CPC .... *H01L 21/02247* (2013.01); *H01L 21/0217* (2013.01); *H01L 21/02205* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 5,614,428 A * | 3/1997 | Kapoor | H01L 21/266 257/E21.197 |
| 2007/0269936 A1 * | 11/2007 | Tanaka | G02F 1/13458 438/133 |
| 2010/0248464 A1 | 9/2010 | Clark | |
| 2015/0024585 A1 | 1/2015 | Luo et al. | |
| 2015/0132938 A1 | 5/2015 | Ahmed et al. | |
| 2015/0179684 A1 * | 6/2015 | Van Duren | H01L 27/1259 438/14 |
| 2017/0365480 A1 | 12/2017 | Swenberg et al. | |
| 2018/0190499 A1 | 7/2018 | Chen | |

OTHER PUBLICATIONS

International Search Report and Written Opinion for PCT/US2019/063943, filed on Mar. 20, 2020.

* cited by examiner

*Primary Examiner* — Shamim Ahmed
(74) *Attorney, Agent, or Firm* — Moser Taboada

(57) ABSTRACT

Methods and apparatus for forming a semiconductor structure with a scaled effective oxide thickness is disclosed. In embodiments, a method includes depositing amorphous silicon capping layer having a first surface atop a first surface of a titanium nitride (TiN) layer, wherein the titanium nitride layer is atop a first surface of a high-k dielectric layer disposed within a film stack; contacting the first surface of the amorphous silicon capping layer with a nitrogen containing gas; and annealing the film stack.

19 Claims, 5 Drawing Sheets

METHOD OF REDUCING EFFECTIVE OXIDE THICKNESS IN A SEMICONDUCTOR STRUCTURE

CROSS-REFERENCE TO RELATED APPLICATIONS

This application claims priority to U.S. provisional application No. 62/775,218 filed Dec. 4, 2018, the contents of which are fully incorporated herein by reference.

FIELD

Embodiments of the present disclosure generally relate to electronic device processing, and more particularly, reducing effective oxide thickness of a film stack and the compositions of the film stack such as high-k dielectric-containing materials and interfacial layer materials.

BACKGROUND

Metal gate/high-k stacks are being increasingly used in metal-oxide-semiconductor field-effect transistors (MOSFETs) in the 7 nm technology node and beyond. However, the inventors have observed that many challenges remain in the art. In particular, the rapid growth of mobile devices, internet, and machine learning are demanding greater transistor technology performance to the more advanced nodes (n<10 nm) with low power consumption. The demand requires the continuation of Moore's Law to shrink the size of one or more transistors while increasing transistor density on a chip. With the perpetual demand for continued miniaturization of chip-manufacturing technologies, the reduction of the effective oxide thickness (EOT) for film stacks including a high-k dielectric layer has become increasingly important in FinFET fabrication. The inventors have observed that capping a high-k dielectric layer during fabrication of a semiconductor device with amorphous silicon (a-Si) film during a high-k dielectric layer anneal is an effective way to reduce the effective oxide thickness; however, the anneal temperature of greater than 800 degrees Celsius problematically causes the a-Si to crystallize and agglomerate resulting in non-uniformity in film thickness and composition, and reduced device reliability.

Accordingly, the inventors have provided improved methods and apparatus for forming a semiconductor structure with a reduced effective oxide thickness and methods for reducing a-Si agglomeration at high temperatures.

SUMMARY

Methods and apparatus for forming a semiconductor structure with a reduced effective oxide thickness are provided herein. In some embodiments, a method for forming a semiconductor structure with a reduced effective oxide thickness, includes: depositing an amorphous silicon capping layer having a top surface atop a titanium nitride (TiN) layer, wherein the titanium nitride layer is atop a high-k dielectric layer disposed within a film stack; contacting the top surface of the amorphous silicon capping layer with a nitrogen containing gas; and annealing the film stack.

In some embodiments, a method of reducing effective oxide thickness of a film stack, includes: depositing an amorphous silicon capping layer having a top surface atop a titanium nitride (TiN) layer, wherein the titanium nitride layer is atop a high-k dielectric layer disposed within a film stack; contacting the top surface of the amorphous silicon capping layer with a nitrogen containing gas; and annealing the film stack.

In some embodiments, a method for forming a semiconductor structure with a reduced effective oxide thickness, includes: depositing an amorphous silicon capping layer having a top surface directly atop a titanium nitride (TiN) layer, wherein the titanium nitride layer is directly atop a high-k dielectric layer disposed within a film stack, and wherein the high-k dielectric layer is directly atop an interfacial layer disposed within a film stack; contacting the top surface of the amorphous silicon capping layer with a hydrazine gas or hydrazine vapor at a temperature of about 300 degrees Celsius to about 600 degrees Celsius for about 30 seconds to about 5 minutes; annealing the film stack at a temperature of about 700 to 1000 degrees Celsius; and removing the amorphous silicon capping layer.

In some embodiments, the present disclosure relates to a non-transitory computer readable medium having instructions stored thereon that, when executed, cause a method for forming a semiconductor structure with a reduced effective oxide thickness, including: depositing an amorphous silicon capping layer having a top surface atop a titanium nitride (TiN) layer, wherein the titanium nitride layer is atop a high-k dielectric layer disposed within a film stack; contacting the top surface of the amorphous silicon capping layer with a nitrogen containing gas; and annealing the film stack.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
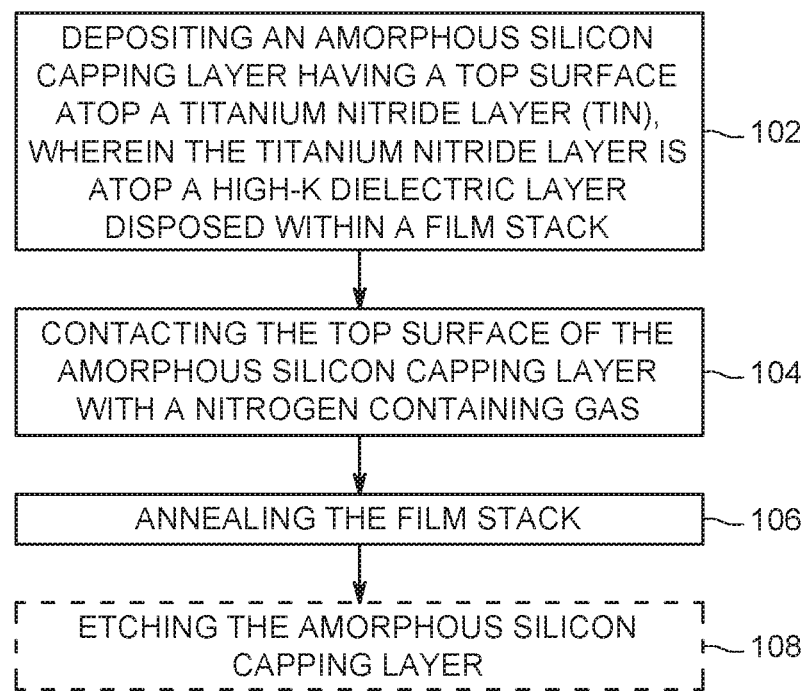
FIG. 1 is a flowchart of a method of forming a semiconductor device in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of present disclosure provide methods for forming a semiconductor structure and methods of reducing effective oxide thickness of a film stack. For example, in some embodiments, a method for forming a semiconductor structure with a scaled effective oxide thickness, includes: depositing an amorphous silicon capping layer having a top surface atop a titanium nitride (TiN) layer, wherein the titanium nitride layer is atop a high-k dielectric layer disposed within a film stack; contacting the top surface of the amorphous silicon capping layer with a nitrogen containing gas; and annealing the film stack.

The methods of the present disclosure treat amorphous silicon (a-Si) with a nitrogen containing gas or vapor under conditions suitable to reduce or eliminate agglomeration of amorphous silicon during a high temperature anneal. The inventors have observed that reducing or eliminating agglomeration of amorphous silicon during a high temperature anneal advantageously increases coverage and uniformity of a high-k dielectric layer. The agglomeration of amorphous silicon during anneal can be prevented, reduced, or eliminated by treating deposited amorphous silicon with nitrogen containing gas or vapor such as hydrazine prior to annealing. The inventors have observed that treating the amorphous silicon in accordance with the present disclosure advantageously maintains the potency of the amorphous silicon capping layer or film in reducing the effective oxide thickness of a film stack including e.g., a high-k dielectric layer and interfacial layer. A scaled or reduced effective oxide thickness in accordance with the present disclosure may be suitable to obtain a desired semiconductor device or desired film stack for use in a semiconductor device. Embodiments of the present disclosure may advantageously be formed using atomic layer deposition (ALD) processes and used within devices that may be subjected to further processing. In some embodiments, methods of the present disclosure advantageously provide a film stack having a desired or predetermined effective oxide thickness suitable for use in fin field-effect transistors (FinFET) in the 7 nm technology node and beyond. In embodiments, the effective oxide thickness of a film stack of the present disclosure is predetermined. For example, the desired effective oxide thickness of a film stack of the present disclosure may be targeted to be between 8 to 9 angstrom (Å) in thickness. In embodiments, the effective oxide thickness of a film stack of the present disclosure may be reduced by about 0.5 to 2.0 angstrom compared to a substantially similar film stack made without the methods of the present disclosure.

FIG. 1 is a flowchart of a method 100 of forming a semiconductor device in accordance with some embodiments of the present disclosure. The method 100 is described below with respect to the stages of depositing various layers including amorphous silicon as depicted in FIGS. 2A-2E and may be performed, for example, in a suitable process chamber such as process chamber 16 in FIG. 3. Exemplary processing systems that may be used to perform the methods disclosed herein may include, but are not limited to, any of the ENDURA®, CENTURA®, or PRODUCER® brand processing systems, commercially available from Applied Materials, Inc., of Santa Clara, Calif. Non-limiting examples of suitable cluster tools and process chambers are disclosed in commonly-owned U.S. Pat. No. 7,405,158, entitled Methods for depositing tungsten layers employing atomic layer deposition techniques issued Jul. 29, 2008 to Lai et al. Other process chambers, including ones available from other manufacturers, may also be suitably used in connection with the teachings provided herein.

Figure 2A:
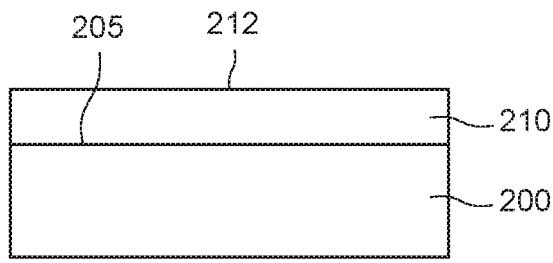
FIGS. 2A-2E are illustrative cross-sectional views of the substrate during different stages of the processing sequence of FIG. 1 in accordance with some embodiments of the present disclosure.

The method 100 is typically performed on a substrate 200 provided to a processing volume of a process chamber, such as a process chamber suitable for performing cyclical deposition such as atomic layer deposition. Although not shown in FIG. 1, in embodiments, a substrate 200 to be processed is first loaded into and positioned within a process chamber (such as process chamber 16 shown in FIG. 3) capable of performing cyclical deposition and the process conditions are adjusted and/or a process chamber suitable for annealing at elevated temperatures. In some embodiments, as shown in FIG. 2A, the substrate 200 includes a first surface 205 and an interfacial layer 210 atop the first surface 205 of substrate 200. The interfacial layer 210 having a first surface 212. Although the following description is made with respect to a substantially planar substrate 200 as shown in FIGS. 2A-2E, in some embodiments, substrate 200 may include one or more features (such as a plurality of trenches, vias or the like) (not shown in FIGS. 2A-2E).

The substrate 200 may be any suitable substrate. For example, the substrate 200 may include one or more of silicon (Si), silicon oxide ($SiO_2$), or the like. In embodiments, the substrate 200 is an oxide substrate. In embodiments, the substrate 200 may include a dielectric layer or dielectric substrate. For example, a low-k material (e.g., a material having a dielectric constant less than silicon oxide, or less than about 3.9), or the like may be suitable for use herein. In addition, the substrate 200 may include additional layers of materials or may have one or more completed or partially completed structures or devices formed in or on the substrate 200 (not shown). In embodiments, the substrate 200 may be, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer. In embodiments the substrate 200 is an oxide substrate, dielectric substrate, or combinations thereof. The substrate 200 is not limited to any particular size or shape. The substrate 200 can be a round wafer having a 200 mm diameter, a 300 mm diameter or other diameters, such as 450 mm, among others. The substrate 200 can also be any polygonal, square, rectangular, curved or otherwise non-circular workpiece, such as a polygonal glass substrate used in the fabrication of flat panel displays.

As shown in FIG. 2A, substrate 200 includes an interfacial layer 210 atop the first surface 205 of substrate 200. In embodiments, interfacial layer 210 is directly atop first surface 205. In embodiments, interfacial layer 210 includes first surface 212. In embodiments, the interfacial layer 210 is deposited by any known means in the art such as chemical vapor deposition (CVD) or atomic layer deposition (ALD) to a thickness sufficient to reduce damage between a high-k dielectric layer 220 and a silicon substrate such as substrate 200, or a thickness sufficient to separate a high-k dielectric layer 220 from substrate 200 such as a thickness of about 5 angstroms to 20 angstroms, or a thickness of about 10 angstroms or 10 angstroms. In embodiments, interfacial layer 210 includes silicon dioxide ($SiO_2$), silicon oxynitride (SiON) or the like.

Figure 2B:
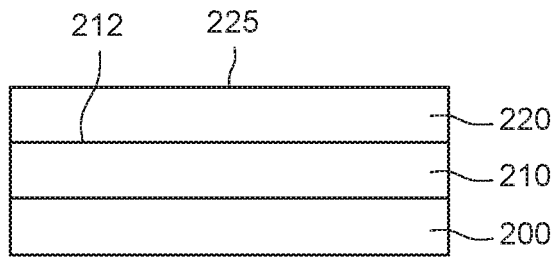

Referring now to FIG. 2B, substrate 200 and interfacial layer 210 is shown with a high-k dielectric layer 220 atop the first surface 212 of interfacial layer 210. In embodiments, high-k dielectric layer 220 is directly atop the first surface 212 of interfacial layer 210, and interfacial layer 210 is directly atop the first surface 205 of substrate 200. In embodiments, the high-k dielectric layer 220 is suitable for use in a film stack of a transistor device. In some embodiments, high-k dielectric layer 220 may be deposited upon the first surface 212 of interfacial layer 210. In embodiments, the high-k dielectric layer 220 may be deposited by any deposition means known in the art to a predetermined thickness to form a film. In embodiments, high-k dielectric layer 220 is made of material with high dielectric constants (high-k materials have dielectric constants greater than 4.0) such as hafnium(IV) oxide ($HfO_2$), zirconium dioxide ($ZrO_2$), aluminum oxide ($Al_2O_3$), barium strontium titanate (BST), lead zircon ate titanate (PZT), zirconium silicate ($ZrSiO_2$), hafnium silicon dioxide ($HfSiO_2$), tantalum dioxide ($TaO_2$), silicon oxide ($SiO_2$), hafnium silicate (HfSiO), and the like. In embodiments, suitable high-k dielectric layers comprise high-k oxides grown by atomic layer deposition to form a thin film wherein the high-k dielectric layer 220 has a thickness of about 10 to 30 angstroms, such as about 25 angstroms. In some embodiments, the high-k dielectric layer 220 comprises or consists of hafnium(IV) oxide ($HfO_2$) having a thickness of about 10 to 30 angstroms, such as about 25 angstroms.

Figure 2C:
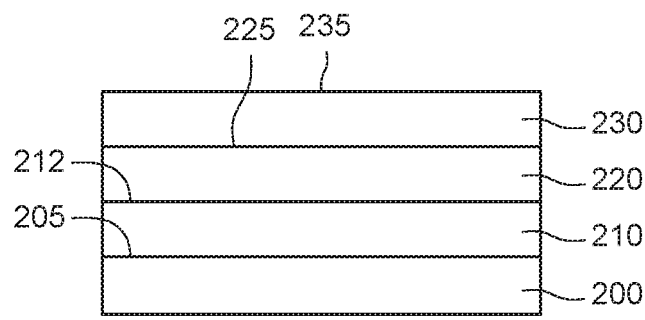

Referring now to FIG. 2C, substrate 200, interfacial layer 210, and high-k dielectric layer 220 is shown with titanium nitride layer 230 atop the first surface 225 of high-k dielectric layer 220. In embodiments, titanium nitride layer 230 is directly atop the first surface 225 of high-k dielectric layer 220, wherein high-k dielectric layer 220 is directly atop the first surface 212 of interfacial layer 210, and interfacial layer 210 is directly atop the first surface 205 of substrate 200. In embodiments, the titanium nitride layer 230 is suitable for use in a film stack of a transistor device. In some embodiments, titanium nitride layer 230 may be deposited upon the first surface 225 of high-k dielectric layer 220. In embodiments, the titanium nitride layer 230 may be deposited by any deposition means known in the art to a predetermined thickness to form a film. In embodiments, titanium nitride layer 230 is made of substantially pure titanium nitrite (TiN) material. In embodiments, suitable titanium nitride layer 230 comprise titanium nitrite film grown by atomic layer deposition to a thickness of about 5 to 25 angstrom, such as 10 to 20 angstrom, or about 15 angstrom or 15 angstrom. In some embodiments, the titanium nitride layer 230 comprises or consists of titanium nitride having a thickness of about 10 to 20 angstrom.

Figure 2D:
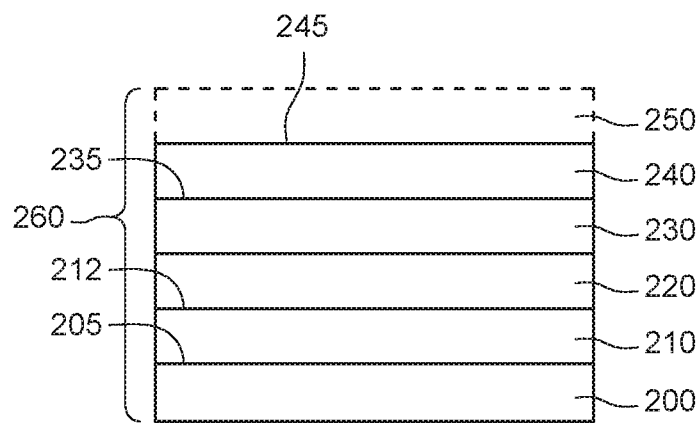

Referring now to FIG. 2D, substrate 200, interfacial layer 210, high-k dielectric layer 220, titanium nitride layer 230 is shown with amorphous silicon capping layer 240 atop the first surface 235 of titanium nitride layer 230. In embodiments, amorphous silicon capping layer 240 is directly atop the first surface 235 of titanium nitride layer 230 which is directly atop high-k dielectric layer 220, wherein high-k dielectric layer 220 is directly atop the first surface 212 of interfacial layer 210, and interfacial layer 210 is directly atop the first surface 205 of substrate 200. In embodiments, the amorphous silicon capping layer 240 is suitable for use in formation of a film stack of a transistor device. In some embodiments, amorphous silicon capping layer 240 may be deposited upon the first surface 235 of titanium nitride layer 230. In embodiments, the amorphous silicon capping layer 240 may be deposited by any deposition means known in the art to a predetermined thickness to form a film. In embodiments, amorphous silicon capping layer 240 may is made of substantially pure amorphous silicon capping layer 240 material. In embodiments, suitable amorphous silicon capping layer 240 may comprise amorphous silicon grown by atomic layer deposition to a thickness of about 20 to 50 angstrom, such as 30 to 40 angstrom, or about 35 angstrom. In some embodiments, the amorphous silicon capping layer 240 comprises or consists of amorphous silicon having a thickness of about 20 to 50 angstrom.

Referring back to FIG. 1, at 102, a method for forming a semiconductor structure with a reduced effective oxide thickness, includes depositing an amorphous silicon capping layer 240 having a top surface 245 atop a titanium nitride layer 230, wherein the titanium nitride layer is atop a high-k dielectric layer 220 disposed within a film stack 260; contacting the top surface 245 of the amorphous silicon capping layer 240 with a nitrogen containing gas; and annealing the film stack 260. In embodiments, the method includes at 104 contacting the top surface 245 of the amorphous silicon capping layer 240 with a nitrogen containing gas or vapor.

In embodiments, the contacting the top surface 245 of the amorphous silicon capping layer 240 with a nitrogen containing gas or vapor is performed under conditions suitable for forming a silicon nitride layer 250 (shown in phantom) atop the top surface 245 or within the amorphous silicon capping layer 240 adjacent to the top surface 245. In embodiments, the nitrogen containing gas comprises or consists of hydrazine gas or hydrazine vapor. In embodiments, the hydrazine gas or vapor is provided in an amount sufficient to form a silicon nitride layer atop or within amorphous silicon capping layer 240. In embodiments, the nitrogen containing gas or vapor contacts the amorphous silicon capping layer 240 top surface 245 at a temperature of about 300 degrees Celsius to about 600 degrees Celsius. In some embodiments, the nitrogen containing gas or vapor contacts the amorphous silicon capping layer 240 top surface 245 at a temperature of about 450 degrees Celsius to about 500 degrees Celsius. In some embodiments, the nitrogen containing gas or vapor contacts the amorphous silicon capping layer 240 top surface 245 for about 30 seconds to about 5 minutes. In some embodiments, the nitrogen containing gas or vapor contacts the amorphous silicon capping layer 240 top surface 245 under conditions wherein the amorphous silicon capping layer 240 has a thickness of 20 to 50 angstrom, the titanium nitride (TiN) layer 230 has a thickness of about 10 to 20 angstrom, and the high-k dielectric layer 220 has a thickness of about 10 to 30 angstrom.

In embodiments, agglomeration of amorphous silicon capping layer 240 during anneal can be prevented by treating the amorphous silicon capping layer 240 with hydrazine gas or vapor before annealing. In embodiments, the agglomeration of amorphous silicon capping layer 240 is prevented after amorphous silicon capping layer 240 is exposed to hydrazine vapor for 2 minutes at 450 degrees Celsius or 1 minute at 500 degrees Celsius. In embodiments, silicon nitride such as SiNx (wherein x is an integer) may form on the top surface 245 of amorphous silicon capping layer 240 after amorphous silicon capping layer 240 is exposed to a nitrogen containing gas such as hydrazine. SiNx formation may pin down the remaining amorphous silicon capping layer 240 and prevent agglomeration of amorphous silicon capping layer 240 during anneal. To retain the potency of amorphous silicon capping layer 240 in reducing the effective oxide thickness during high-k dielectric layer 220 anneal, the bulk composition of the amorphous silicon capping layer 240 remains unchanged after nitrogen containing gas such as hydrazine treatment, e.g., wherein nitrogen penetrated a limited portion of the amorphous silicon capping layer 240 to form e.g., a silicon nitride layer 250 (SiNx layer) atop or within amorphous silicon capping layer 240. In some embodiments, nitrogen is present at the top of a nitrogen gas treated amorphous silicon capping layer 240. Therefore, the potency of the amorphous silicon capping layer 240 in reducing the effective oxide thickness of the film stack 260 including a high-k dielectric layer 220 is unlikely to be impacted.

Referring back to FIG. 1, at 106, the method for forming a semiconductor structure with a reduced effective oxide thickness includes annealing the film stack 260. In embodiments, annealing is performed at a temperature of about 700 to 1000 degrees Celsius. For example, the substrate 200 positioned within process chamber 16 may be heated to a temperature in the amount of about 700 to 1000 degrees Celsius. In embodiments of the present disclosure, the amorphous silicon capping layer 240 does not agglomerate and substantially covers the first surface 235 during anneal. In some embodiments, subsequent to the annealing, the effective oxide thickness of the film stack including a high-k dielectric layer is reduced by about 0.5 to 2.0 angstroms, about 0.5 to 1.5 angstroms, such as 2 angstroms or 1 angstrom. In embodiments, the effective oxide thickness of the film stack including a high-k dielectric layer is reduced by 1 angstrom. In embodiments, subsequent to the annealing, the effective oxide thickness of the high-k dielectric layer and the interfacial layer is reduced by about 0.5 to 2.0 angstroms, about 0.5 to 1.5 angstroms, such as 2 angstroms or 1 angstrom. In some embodiments, subsequent to annealing, the method further comprises etching the amorphous silicon capping layer. In some embodiments, such as embodiments including removing or etching the amorphous silicon capping layer, subsequent to etching or removing the amorphous silicon capping layer, an effective oxide thickness of the film stack is reduced by about 0.5 to 2.0 angstrom.

Figure 2E:
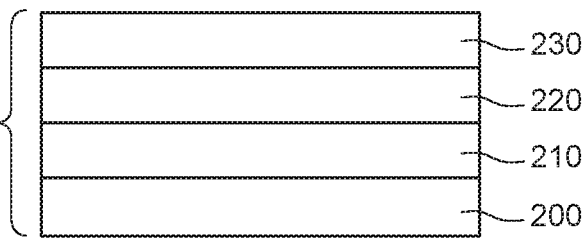

Referring back to FIG. 1, at 108, and FIG. 2E, the method of the present disclosure may include etching the amorphous silicon capping layer 240, such that the film stack 260 comprises substrate 200, interfacial layer 210, and high-k dielectric layer 220 with titanium nitride layer 230 atop the first surface 225 of high-k dielectric layer 220. In some etched embodiments, effective oxide thickness of the high-k dielectric layer and interfacial layer 210 is reduced by about 0.5 to 2.0 angstroms, such as 2 angstroms or 1 angstrom.

Figure 3:
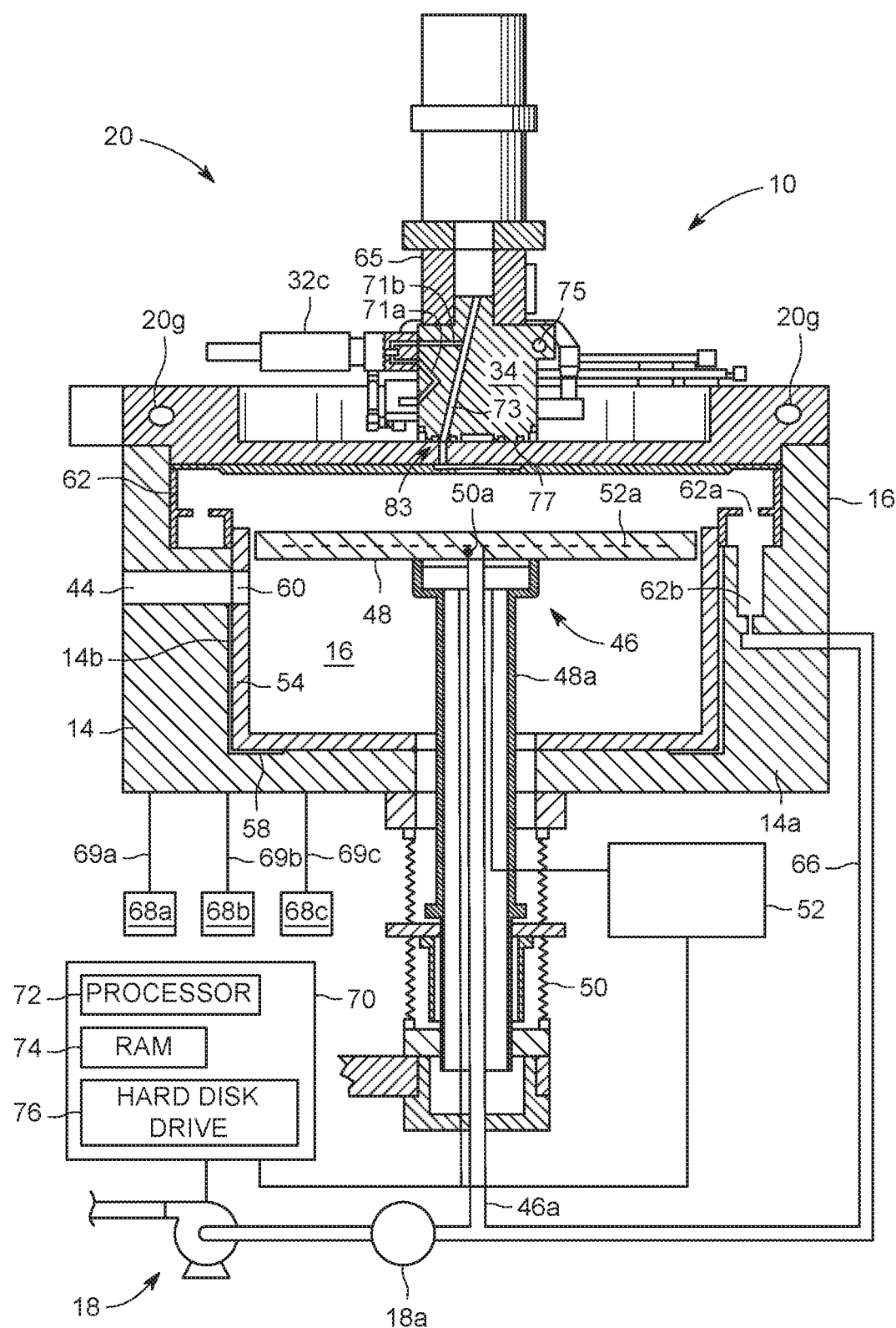
FIG. 3 is a device suitable for performing methods and forming devices in accordance with the present disclosure.

Referring to FIG. 3, a process chamber 16 suitable for depositing layers and annealing in accordance with the present disclosure in a single process chamber is shown. In embodiments, process chamber 16 may be configured to operate in both CVD mode and a cyclical deposition mode (ALD). One example of such a chamber is described in U.S. Pat. No. 6,878,206 entitled Lid Assembly for a Processing System to Facilitate Sequential Deposition Techniques filed on Dec. 12, 2001, and assigned to Applied Materials. Still referring to FIG. 3, disposed within process chamber 16 is a heater/lift assembly 46 that includes a support pedestal 48 connected to a support shaft 48a suitable for supporting a wafer. The support pedestal 48 is positioned between the support shaft 48a and the lid assembly 20 when the lid assembly 20 is in the closed position. The support shaft 48a extends from the support pedestal 48 away from lid assembly 20 through a passage formed in the housing 14. A bellows 50 is attached to a portion of the housing 14 disposed opposite to the lid assembly 20 to prevent leakage into the process chamber 16 from between the support shaft 48a and housing 14. The heater/lift assembly 46 may be moved vertically within the process chamber 16 so that a distance between support pedestal 48 and lid assembly 20 may be controlled. A sensor (not shown) provides information concerning the position of support pedestal 48 within process chamber 16.

The support pedestal 48 includes an embedded thermocouple 50a that may be used to monitor the temperature thereof. For example, a signal from the thermocouple 50a may be used in a feedback loop to control power applied to a heater element 52a by a power source 52. The heater element 52a may be a resistive heater element or other thermal transfer device disposed in or in contact with the support pedestal 48 utilized to control the temperature thereof. Optionally, support pedestal 48 may be heated using a heat transfer fluid (not shown).

The support pedestal 48 may be formed from any process-compatible material, including aluminum nitride and aluminum oxide ($Al_2O_3$ or alumina) and may also be configured to hold a substrate 200 (not shown) thereon employing a vacuum, i.e. support pedestal 48 may be a vacuum chuck. To that end, support pedestal 48 may include a plurality of vacuum holes (not shown) that are placed in fluid communication with a vacuum source, such as pump system via vacuum tube routed through the support shaft 48a.

A liner assembly is disposed in the process chamber 16 and includes a cylindrical portion 54 and a planar portion 56. The cylindrical portion 54 and the planar portion 56 may be formed from any suitable material such as aluminum, ceramic and the like. The cylindrical portion 54 surrounds the support pedestal 48. The cylindrical portion 54 additionally includes an aperture 60 that aligns with the slit valve opening 44 disposed a side wall 14b of the housing 14 to allow entry and egress of substrates from the process chamber 16.

The planar portion 56 extends transversely to the cylindrical portion 54 and is disposed against a chamber bottom 14a of process chamber 16 disposed opposite to lid assembly 20. The liner assembly defines a channel 58 between the housing 14 and both cylindrical portion 54 and planar portion 56. Specifically, a first portion of channel 58 is defined between the chamber bottom 14a and planar portion 56. A second portion of channel 58 is defined between the side wall 14b of the housing 14 and the cylindrical portion 54. A purge gas is introduced into the channel 58.

Disposed along the side walls 14b of the process chamber 16 proximate the lid assembly 20 is a pumping channel 62. The pumping channel 62 includes a plurality of apertures, one of which is shown as a first aperture 62a. The pumping channel 62 includes a second aperture 62b that is coupled to a pump system 18 by a conduit 66. A throttle valve 18A is coupled between the pumping channel 62 and the pump system 18. The pumping channel 62, throttle valve 18A and pump system 18 control the amount of flow from the process chamber 16. The size and number and position of apertures such as first aperture 62a in communication with the process chamber 16 are configured to achieve uniform flow of gases exiting the lid assembly 20 over support pedestal 48 and substrate 200 when seated thereon. A plurality of supplies 68a, 68b and 68c of process and/or other fluids, are in fluid communication with one of valves 32a, 32b or 32c through a sequence of conduits (not shown) formed through the housing 14, lid assembly 20, and gas manifold 34.

A controller 70 regulates the operations of the various components of system 10. The controller 70 includes a processor 72 in data communication with memory, such as random access memory 74 and a hard disk drive 76 and is in communication with at least the pump system 18, the power source 52, and valves 32a, 32b and 32c. The random access memory 74 includes instructions stored thereon that, when read by the processor 72, control the operation of the system 10 to perform methods as disclosed herein on the structures described herein within the process chamber. In some embodiments, the memory is a non-transitory computer readable medium. In embodiments, the memory, or computer-readable medium of a CPU may be included including one or more of readily available memory such as random access memory (RAM), read only memory (ROM), floppy disk, hard disk, or any other form of digital storage, local or remote. In embodiments, support circuits are coupled to a CPU for supporting the processor in a conventional manner. These circuits include cache, power supplies, clock circuits, input/output circuitry and subsystems, and the like.

In some embodiments, although any type of process fluid may be employed, one example of process fluids are precursors as described above, and optionally a purge fluid as described above such as argon (Ar) gas. Nitrogen ($N_2$) may also be used as a purge gas. The chamber pressure may be in the pressure range as described above, or may be in the range of 1-150 Torr or 1-50 Torr, and the support pedestal 48 is heated in the range of 300 degree Celsius to 600 degrees Celsius, such that the substrate may be maintained at a set temperature, such as the substrate at a temperature of 350 degrees Celsius to about 470 degrees Celsius, or 400 degrees Celsius to about 450 degrees Celsius. In embodiments, the process fluids such as precursors may be flowed into the process chamber 16 with a carrier fluid, such as argon (Ar). However, the purge fluid might differ from the carrier fluid or precursors, oxygen containing gas, or reactive gas.

In vapor deposition embodiments in accordance with the present disclosure, the methods include performing an atomic layer deposition (ALD) process to deposit a substrate, interfacial layer, high-k dielectric layer, titanium nitrite layer, amorphous silicon capping layer 240 as described above. One cycle of ALD may include flowing precursors into process chamber 16 including a substrate, purging process chamber 16 such as pumping so as to remove all process fluids, and, after pumping supplying a reactive gas such as precursor containing gas. A subsequent purge may be performed to remove unreacted reactive gas, precursors, or by-products thereof. After pumping supplying a reactive gas such as a silicon precursor containing gas. A subsequent purge may be performed to remove unreacted reactive gas, precursors, or by-products thereof. In embodiments, the ALD sequence of cycles is repeated until the layer being formed has desired characteristics, such as thickness, conductivity and the like. In embodiments, the ALD sequence of cycles is repeated until the layer being formed has desired characteristics, such as desired thickness described above, or predetermined quantity of e.g., amorphous silicon. In some embodiments, purge gases may be strategically delivered through the lower portion of the passage 73, sweeping off cleaning agents from the gas manifold 34 and baffle plate.

Figure 4:
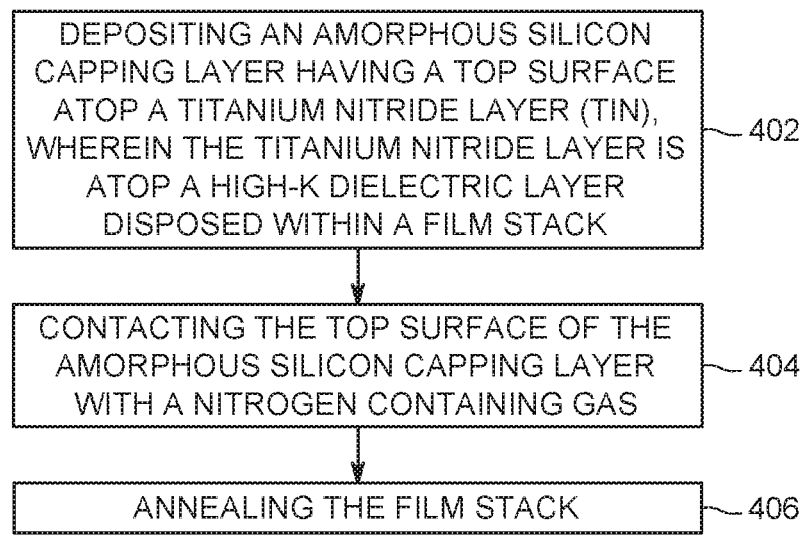
FIG. 4 is a flowchart of a method for forming a semiconductor structure with a reduced effective oxide thickness in accordance with some embodiments of the present disclosure.

Referring now to FIG. 4, a method for forming a semiconductor structure with a reduced effective oxide thickness, is shown including: depositing an amorphous silicon capping layer 240 having a top surface 245 directly atop a titanium nitride (TiN) layer 230, wherein the titanium nitride layer 230 is directly atop a high-k dielectric layer 220 disposed within a film stack 260, and wherein the high-k dielectric layer 220 is directly atop an interfacial layer 210 disposed within a film stack 260. In embodiments, the method includes at 404 contacting the top surface 245 of the amorphous silicon capping layer 240 with a hydrazine gas or hydrazine vapor at a temperature of about 300 degrees Celsius to about 600 degrees Celsius for about 30 seconds to about 5 minutes. In embodiments, the method includes at 406 annealing the film stack at a temperature of about 700 to 1000 degrees Celsius. In embodiments, the method includes at 408 removing the amorphous silicon capping layer 240. In embodiments, subsequent to the annealing, an effective oxide thickness of the film stack is reduced by about 0.5 to 2 angstroms. In embodiments, the nitrogen containing vapor comprises hydrazine gas or vapor provided under conditions described above. In some embodiments, a nitrogen containing vapor contacts the amorphous silicon capping layer 240 top surface 245 at a temperature of about 300 degrees Celsius to about 600 degrees Celsius for about 30 seconds to about 5 minutes. In some embodiments, annealing is performed at a temperature of about 700 to 1000 degrees Celsius. In some embodiments, the amorphous silicon capping layer 240 has a thickness of 20 to 50 angstrom, the high-k capping layer 220 has a thickness of about 10 to 30 angstrom. In embodiments, the nitrogen containing gas comprising or consisting of hydrazine contacts the amorphous silicon capping layer top surface at a temperature of about 300 degrees Celsius to about 600 degrees Celsius. In embodiments, the nitrogen containing gas comprising or consisting of hydrazine contacts the amorphous silicon capping layer top surface at a temperature of about 450 degrees Celsius to about 500 degrees Celsius. In embodiments, the nitrogen containing gas comprising or consisting of hydrazine contacts the amorphous silicon capping layer top surface for about 30 seconds to about 5 minutes.

Figure 5:
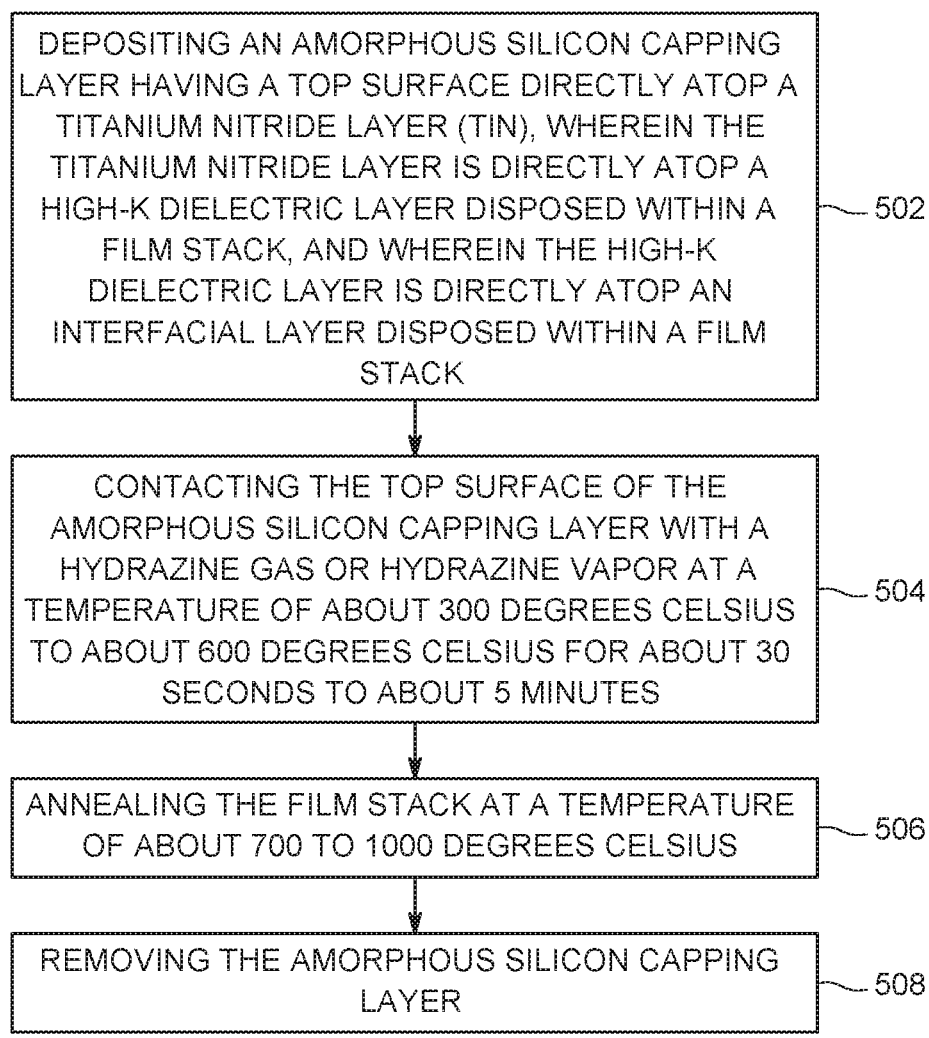
FIG. 5 is a flowchart of a method for forming a semiconductor structure with a reduced effective oxide thickness in accordance with some embodiments of the present disclosure.

Referring now to FIG. 5, a method for forming a semiconductor structure with a reduced effective oxide thickness, is shown including: at process sequence 502 depositing an amorphous silicon capping layer having a top surface directly atop a titanium nitride (TiN) layer, wherein the titanium nitride layer is directly atop a high-k dielectric layer disposed within a film stack, and wherein the high-k dielectric layer is directly atop an interfacial layer disposed within a film stack. In embodiments, the method includes at process sequence 504 contacting the top surface of the amorphous silicon capping layer with a hydrazine gas or hydrazine vapor at a temperature of about 300 degrees Celsius to about 600 degrees Celsius for about 30 seconds to about 5 minutes. In embodiments, the method includes at process sequence 506 annealing the film stack at a temperature of about 700 to 1000 degrees Celsius. In some embodiments, the method includes at process sequence 508 removing the amorphous silicon capping layer.

Other embodiments of the present disclosure include a method for forming a semiconductor structure with a reduced effective oxide thickness, including: depositing amorphous silicon capping layer having a first surface atop a first surface of a titanium nitride (TiN) layer, wherein the titanium nitride layer is atop a first surface of a high-k dielectric layer disposed within a film stack; contacting the first surface of the amorphous silicon capping layer with a hydrazine gas or hydrazine vapor at a temperature of about 300 degrees Celsius to about 600 degrees Celsius for about 30 seconds to about 5 minutes; and annealing the film stack at a temperature of about 700 to 1000 degrees Celsius. The film stack may be etched to remove the amorphous silicon capping layer.

Other embodiments, of the present disclosure relate to a non-transitory computer readable medium having instructions stored thereon that, when executed, cause a method for forming a semiconductor structure with a reduced effective oxide thickness, comprising: depositing an amorphous silicon capping layer having a top surface atop a titanium nitride (TiN) layer, wherein the titanium nitride layer is atop a high-k dielectric layer disposed within a film stack;

contacting the top surface of the amorphous silicon capping layer with a nitrogen containing gas; and annealing the film stack.

Other embodiments, of the present disclosure relate to a non-transitory computer readable medium having instructions stored thereon that, when executed, cause a method for forming a semiconductor structure with a reduced effective oxide thickness, comprising: depositing an amorphous silicon capping layer having a top surface atop a titanium nitride (TiN) layer, wherein the titanium nitride layer is atop a high-k dielectric layer disposed within a film stack; contacting the top surface of the amorphous silicon capping layer with a nitrogen containing gas; and annealing the film stack.

Other embodiments, of the present disclosure relate to a non-transitory computer readable medium having instructions stored thereon that, when executed, cause a method for forming a semiconductor structure with a reduced effective oxide thickness, comprising: depositing an amorphous silicon capping layer having a top surface directly atop a titanium nitride (TiN) layer, wherein the titanium nitride layer is directly atop a high-k dielectric layer disposed within a film stack, and wherein the high-k dielectric layer is directly atop an interfacial layer disposed within a film stack; contacting the top surface of the amorphous silicon capping layer with a hydrazine gas or hydrazine vapor at a temperature of about 300 degrees Celsius to about 600 degrees Celsius for about 30 seconds to about 5 minutes; annealing the film stack at a temperature of about 700 to 1000 degrees Celsius; and removing the amorphous silicon capping layer.

While the foregoing is directed to embodiments of the present disclosure, other and further embodiments of the disclosure may be devised without departing from the basic scope thereof.

The invention claimed is:

1. A method for forming a semiconductor structure with a reduced effective oxide thickness, comprising:
    depositing an amorphous silicon capping layer having a top surface atop a titanium nitride (TiN) layer, wherein the titanium nitride layer is atop a high-k dielectric layer disposed within a film stack;
    contacting the top surface of the amorphous silicon capping layer with a nitrogen containing gas; and
    annealing the film stack,
    wherein depositing, contacting, and annealing are performed in a same chamber.

2. The method of claim 1, wherein the nitrogen containing gas comprises hydrazine vapor.

3. The method of claim 1, wherein the nitrogen containing gas contacts the amorphous silicon capping layer top surface at a temperature of about 300 degrees Celsius to about 600 degrees Celsius.

4. The method of claim 1, wherein the nitrogen containing gas contacts the amorphous silicon capping layer top surface at a temperature of about 450 degrees Celsius to about 500 degrees Celsius.

5. The method of claim 1, wherein the nitrogen containing gas contacts the amorphous silicon capping layer top surface for about 30 seconds to about 5 minutes.

6. The method of claim 1, wherein annealing is performed at a temperature of about 700 to 1000 degrees Celsius.

7. The method of claim 1, wherein subsequent to annealing, further comprises etching the amorphous silicon capping layer.

8. The method of claim 1, further comprising etching the amorphous silicon capping layer, wherein subsequent to etching, an effective oxide thickness of the film stack is reduced by about 0.5 to 2.0 angstrom.

9. The method of claim 1, wherein at least one of the amorphous silicon capping layer has a thickness of 20 to 50 angstrom, the titanium nitride (TiN) layer has a thickness of about 10 to 20 angstrom, or the high-k dielectric layer has a thickness of about 10 to 30 angstrom.

10. The method of claim 1, wherein the titanium nitride (TiN) layer is deposited in the same chamber as the amorphous silicon capping layer.

11. A method of reducing effective oxide thickness of a film stack, comprising:
    depositing an amorphous silicon capping layer having a top surface atop a titanium nitride (TiN) layer, wherein the titanium nitride layer is atop a high-k dielectric layer disposed within a film stack;
    contacting the top surface of the amorphous silicon capping layer with a nitrogen containing gas; and
    annealing the film stack,
    wherein depositing, contacting, and annealing are performed in a same chamber.

12. The method of claim 11, wherein subsequent to the annealing, an effective oxide thickness of the film stack is reduced by about 0.5 to about 2 angstrom.

13. The method of claim 11, wherein the nitrogen containing gas comprises hydrazine.

14. The method of claim 11, wherein the nitrogen containing gas contacts the amorphous silicon capping layer top surface at a temperature of about 300 degrees Celsius to about 600 degrees Celsius.

15. The method of claim 11, wherein the nitrogen containing gas contacts the amorphous silicon capping layer top surface for about 30 seconds to about 5 minutes.

16. The method of claim 11, wherein annealing is performed at a temperature of about 700 to 1000 degrees Celsius.

17. The method of claim 11, wherein the amorphous silicon capping layer has a thickness of 20 to 50 angstrom.

18. The method of claim 11, wherein the high-k dielectric layer has a thickness of about 10 to 30 angstrom.

19. A method for forming a semiconductor structure with a reduced effective oxide thickness, comprising:
    depositing an amorphous silicon capping layer having a top surface directly atop a titanium nitride (TiN) layer, wherein the titanium nitride layer is directly atop a high-k dielectric layer disposed within a film stack, and wherein the high-k dielectric layer is directly atop an interfacial layer disposed within a film stack;
    contacting the top surface of the amorphous silicon capping layer with a hydrazine gas or hydrazine vapor at a temperature of about 300 degrees Celsius to about 600 degrees Celsius for about 30 seconds to about 5 minutes;
    annealing the film stack at a temperature of about 700 to 1000 degrees Celsius,
    wherein depositing, contacting, and annealing are performed in a same chamber; and
    removing the amorphous silicon capping layer.

* * * * *